(12) United States Patent
Chen et al.

(10) Patent No.: US 7,210,088 B2
(45) Date of Patent: Apr. 24, 2007

(54) FAULT ISOLATION THROUGH NO-OVERHEAD LINK LEVEL CRC

(75) Inventors: Dong Chen, Croton On Hudson, NY (US); Paul W. Coteus, Yorktown Heights, NY (US); Alan G. Gara, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 354 days.

(21) Appl. No.: 10/468,996

(22) PCT Filed: Feb. 25, 2002

(86) PCT No.: PCT/US02/05572

§ 371 (c)(1),
(2), (4) Date: Aug. 22, 2003

(87) PCT Pub. No.: WO02/069145

PCT Pub. Date: Sep. 6, 2002

(65) Prior Publication Data

US 2004/0098660 A1    May 20, 2004

Related U.S. Application Data

(60) Provisional application No. 60/271,124, filed on Feb. 24, 2001.

(51) Int. Cl.
*G06F 11/00* (2006.01)
*G06F 13/00* (2006.01)
*G06F 7/02* (2006.01)
*H03M 13/00* (2006.01)

(52) U.S. Cl. .................. 714/746; 714/758; 714/807; 714/819

(58) Field of Classification Search ............... 714/746, 714/752, 758
See application file for complete search history.

(56) References Cited

U.S. PATENT DOCUMENTS 5,517,508 A * 5/1996 Scott ........................ 714/776
5,802,080 A * 9/1998 Westby ..................... 714/807

FOREIGN PATENT DOCUMENTS

JP        07-235880        9/1995

* cited by examiner

*Primary Examiner*—Phung My Chung
(74) *Attorney, Agent, or Firm*—Scully, Scott, Murphy & Presser, P.C.; Daniel P. Morris, Esq.

(57) ABSTRACT

A fault isolation technique for checking the accuracy of data packets transmitted between nodes of a parallel processor. An independent crc is kept of all data sent from one processor to another, and received from one processor to another. At the end of each checkpoint, the crcs are compared. If they do not match, there was an error. The crcs may be cleared and restarted at each checkpoint. In the preferred embodiment, the basic functionality is to calculate a CRC of all packet data that has been successfully transmitted across a given link. This CRC is done on both ends of the link, thereby allowing an independent check on all data believed to have been correctly transmitted. Preferably, all links have this CRC coverage, and the CRC used in this link level check is different from that used in the packet transfer protocol. This independent check, if successfully passed, virtually eliminates the possibility that any data errors were missed during the previous transfer period.

18 Claims, 9 Drawing Sheets

Table of signals for sending side:

| Signal Name | Function |
|---|---|
| clkx2 | The clock used for the sending stage. If the stage is operating in half speed mode then this clock should also be operating at half the "baseline" speed. |
| reset | The synchronous reset |
| valid | Indicates that the current data byte/word is to be included in the CRC. |

Table of signals for receiving side:

| Signal Name | Function |
| --- | --- |
| clkx2 | The clock used for the receiving stage. If the receiving unit is operating in half speed mode then this clock is also running at half speed. |
| reset | The synchronous reset |
| Valid | Indicates that the current data byte/word is to be included in the CRC. |
| received_data | The received byte/word |
| packet_accepted | The last byte/word of the packet has been received and the packet passes all integrity tests. |
| end_of_packet | The last byte/word of the packet has been received. Packet_accept is used to distinguish packets with error from those that are to be accepted. |

*Figure 10*

FAULT ISOLATION THROUGH NO-OVERHEAD LINK LEVEL CRC

CROSS-REFERENCE TO RELATED APPLICATIONS

The present invention claims the benefit of commonly-owned, co-pending U.S. Provisional Patent Application Ser. No. 60/271,124 filed Feb. 24, 2001 entitled MASSIVELY PARALLEL SUPERCOMPUTER, the whole contents and disclosure of which is expressly incorporated by reference herein as if fully set forth herein. This patent application is additionally related to the following commonly-owned, co-pending U.S. patent applications filed on even date herewith, the entire contents and disclosure of each of which is expressly incorporated by reference herein as if frilly set forth herein. U.S. patent application Ser. No. 10/468,999, filed Aug. 22, 2003, for "Class Networking Routing"; U.S. patent application Ser. No. 10/469,000, filed Aug. 22, 2003, for "A Global Tree Network for Computing Structures"; U.S. patent application Ser. No. 10/468,997, filed Aug. 22, 2003, for 'Global Interrupt and Barrier Networks"; U.S. patent application Ser. No. 10/469,001, filed Aug. 22, 2003, for 'Optimized Scalable Network Switch"; U.S. patent application Ser. No. 10/468,991, filed Aug. 22, 2003, for "Arithmetic Functions in Torus and Tree Networks'; U.S. patent application Ser. No. 10/468,992, filed Aug. 22, 2003, for 'Data Capture Technique for High Speed Signaling"; U.S. patent application Ser. No. 10/468,995, filed Aug. 22, 2003, for 'Managing Coherence Via Put/Get Windows'; U.S. patent application Ser. No. 10/468,994, filed Aug. 22, 2003, for "Low Latency Memory Access And Synchronization"; U.S. patent application Ser. No. 10/468,990, filed Aug. 22, 2003, for 'Twin-Tailed Fail-Over for Fileservers Maintaining Full Performance in the Presence of Failure"; U.S. patent application Ser. No. 10/468,996, filed Aug. 22, 2003, for "Fault Isolation Through No-Overhead Link Level Checksums'; U.S. patent application Ser. No. 10/469,003, filed Aug. 22, 2003, for "Ethernet Addressing Via Physical Location for Massively Parallel Systems"; U.S. patent application Ser. No. 10/469,002, filed Aug. 22, 2003, for "Fault Tolerance in a Supercomputer Through Dynamic Repartitioning"; U.S. patent application Ser. No. 10/258,515, filed Oct. 24, 2002, now U.S. Pat. No. 6,895,416, issued May 17, 2005, for "Checkpointing Filesystem"; U.S. patent application Ser. No. 10/468,998, filed Aug. 22, 2003, for "Efficient Implementation of Multidimensional Fast Fourier Transform on a Distributed-Memory Parallel Multi-Node Computer"; U.S. patent application Ser. No. 10/468,993, filed Aug. 22, 2003, for "A Novel Massively Parallel Supercomputer"; and U.S. patent application Ser. No. 10/083,270, filed Feb. 25, 2002, now U.S. Pat. No. 6,592,449, issued Jul. 15, 2003, for "Smart Fan Modules and System".

BACKGROUND OF THE INVENTION

1. Field of the Invention

This invention relates to the field distributed-memory message-passing parallel computer design and system software, as applied for example to computation in the field of life sciences. More specifically, it relates to system software libraries supporting global communications used by many parallel applications.

2. Background Art

Provisional patent application No. 60/271,124, titled "A Massively Parallel SuperComputer" describes a computer comprised of many computing nodes and a smaller number of I/O nodes. These nodes are connected by several networks. In particular, a dual-functional tree network that supports integer combining operations, such as integer maximums and minimums.

In parallel supercomputers, there is an enormous amount of data sent from one processor to another in the form of messages. These messages are protected from corruption by standard techniques such as parity checking, crc checking, etc where the parity of the data, or crc of the data, is included in the data sent from one processor to another, calculated by the receiving processor, and compared. However, if there is a failure in the logic used to compute the compare, or double error faults escape parity detection, etc, some message errors may propagate through the machine without detection. In the machine described in the above-mentioned provisional patent application No. 60/271,124, there are approximately 64,000 processors with about 1,000,000 links sending 256 bytes each microsecond. Even with an error rate as low as 1 in 10–15, which is an extremely low bit error rate, there would be 1 error per second. What is needed is a simple means to insure that no error has occurred in data transmission between sender and receiver, without additional computation.

SUMMARY OF THE INVENTION

An object of this invention is to improve fault detection in parallel supercomputers.

Another object of the present invention is to provide a no-overhead fault detection procedure for massively parallel supercomputers.

A further object of the present invention is to offer an additional means to detect errors, which may occur in the transmission of data sent from one processor to another processor in parallel supercomputers without incurring a penalty of sending additional data between processors.

These and other objectives are attained with a fault isolation technique embodying the present invention. Generally, in accordance with this invention, an independent crc (cyclic redundancy check) is kept of all data sent from one processor to another, and received from one processor to another. At the end of each checkpoint, the crcs are compared. If they do not match, there was an error. The crcs are cleared and restarted at each checkpoint.

In the preferred embodiment, the basic functionality is to calculate a CRC of all packet data that has been successfully transmitted across a given link. This CRC is done on both ends of the link, thereby allowing an independent check on all data believed to have been correctly transmitted. Preferably, all links have this CRC coverage, and the CRC used in this link level check is different from that used in the packet transfer protocol. This independent check, if successfully passed, virtually eliminates the possibility that any data errors were missed during the previous transfer period.

Further benefits and advantages of the invention will become apparent from a consideration of the following detailed description, given with reference to the accompanying drawings, which specify and show preferred embodiments of the invention.

BRIEF DESCRIPTION OF THE DRAWINGS

FIG. 10 is a table identifying signals used in the circuit of FIG. 8.

DETAILED DESCRIPTION OF THE PREFERRED EMBODIMENTS

Figure 1:
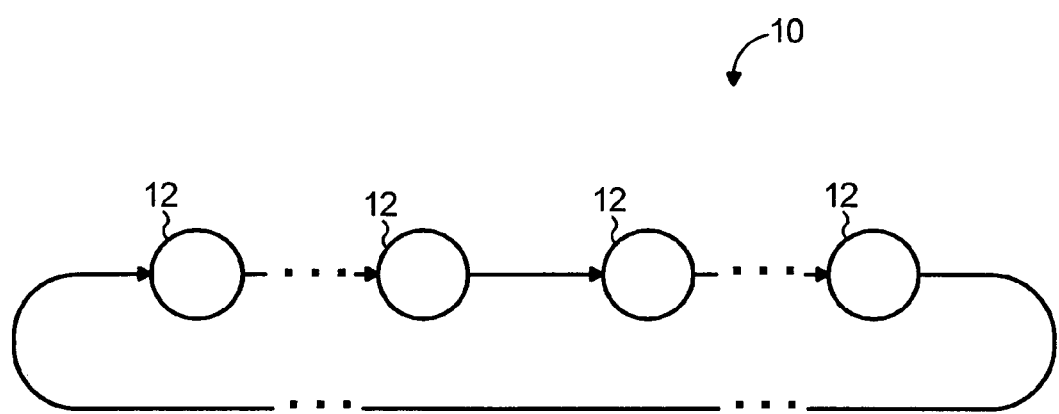
FIG. 1 is a simplified representation of a parallel supercomputer embodying this invention.

FIG. 1 illustrates a massively parallel computer system 10 embodying this invention. System 10 is a scalable ultra-computer computer based on $2^{16}$=65,536 nodes 12. Each node 12 is very simple comprising a single ASIC and 9 SDRAM-DDR memory chips. The nodes are interconnected through 6 networks, the highest aggregate bandwidth of which is a nearest neighbor link that maps the nodes into a 64×32×32 physical 3-dimensional torus. There are virtually no asymmetries in this interconnect as the modes communicate with the same bandwidth and nearly the same latency to nodes that are physically close as to those which are on a neighboring racks. This allows for a simple programming model. The ASIC that powers the nodes is based on a system-on-a-chip technology and incorporates all of the needed functionality. It also contains 4 MB of extremely high bandwidth embedded DRAM that is of order 9 cycles from the registers on most L1 cache misses. The nodes 12 themselves are physically small allowing for a very high density of processing.

Figure 2:
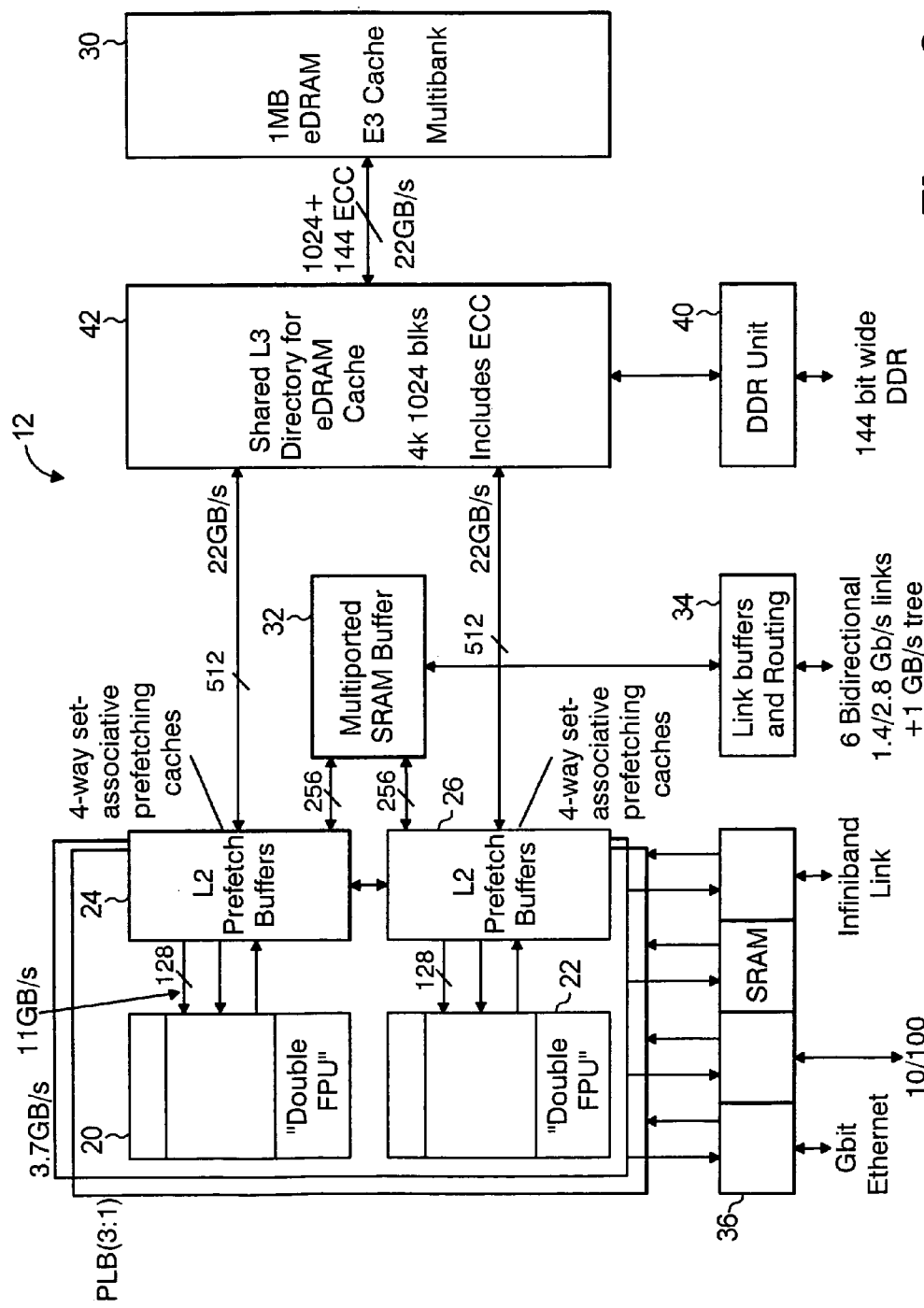
FIG. 2 is a block diagram of a processing node of the supercomputer of FIG. 1.

FIG. 2 is a block diagram of one node 12 of system 10. The node includes two embedded cores 20 and 22, each with a double floating point core with a target peak performance of 2.8 GF. Preferably, system 10 supports virtual cut-through routing that will allow any tree node to communicate with low latency. Also, preferably, the memory system is architectured for high bandwidth, low latency memory and cache accesses. Node 12 further includes prefetch buffers 24 and 26, eDRAM 30, multiported SRAM buffer 32, link buffers 34, interface module 36, DDR unit 40 and a shared directory 42 for the eDRAM.

Figure 3:
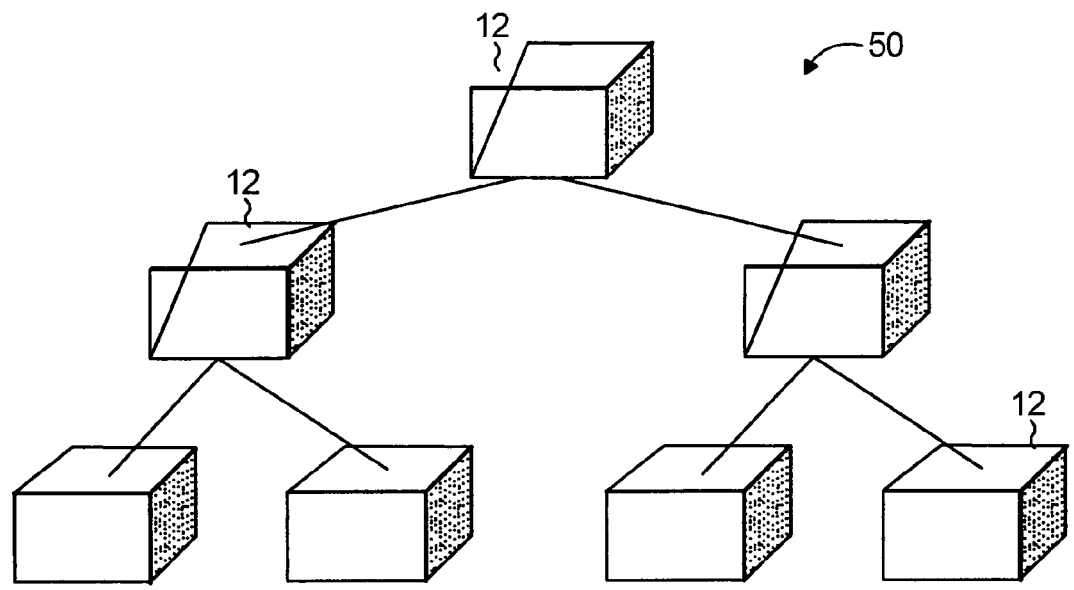
FIG. 3 shows nodes of the supercomputer connected together by a global combining tree.

With reference to FIG. 3, each I/O processing node 12 is connected through a global combining tree, represented at 50, to, for example, 64 compute nodes. Any compute node can read or write a RAID disk at full gigabit speed. This binary combining tree actually extends over the entire machine 10, allowing data to be sent from any node to all others (broadcast), or a subset of nodes, with a latency of less than 1 usec. Message passing is supported on the global combining tree, and controlled by a second processor within each ASIC, allowing intensive operations like all-to-all communication to proceed independent of the compute nodes. Every branch of this tree has a target bandwidth of 1.4 GB/s, or 2 bytes per processor cycle, in both the transmit and receive directions. The hardware functionality built into the tree is integer addition, subtraction, maximum, minimum and broadcast. The functions are implemented in the lowest latency possible manner. The same tree can be utilized for global broadcast of data, rather than shipping it around in rings.

Figure 4:
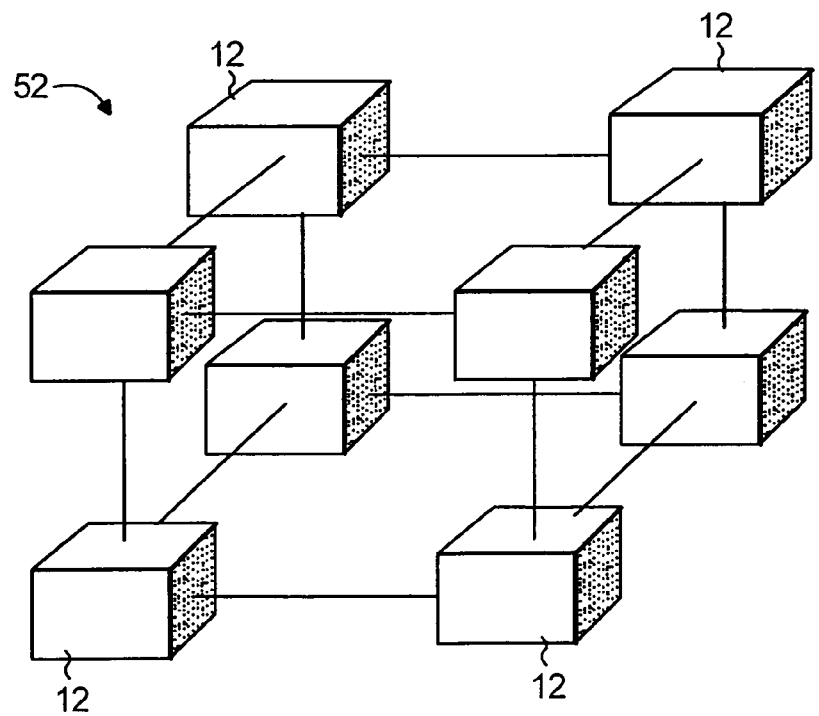
FIG. 4 shows nodes of the supercomputer connected together in the form of a torus.

In addition, the physical machine architecture is most closely tied to the 3 D torus as represented at 52 FIG. 4. This is a simple 3-dimensional nearest neighbor interconnect which is "wrapped" at the edges. All neighbors are equally distant, except for time-of-flight differences such as exist between different racks of ASICs, making code easy to write and optimize. The nearest neighbor links are targeted as 4× the processor speed (2.8 Gb/s in each direction). Each node therefore supports 6 independent bi-directional nearest neighbor links with an aggregate bandwidth of 4.2 GB/s. For example, in system 10, circuit cards are wired in 2×2×2 sub-cubes while mid-planes, two per rack, are wired as 8×8×8 sub-cubes. The entire 64k machine is a 64×32×32 torus.

In system 10, an independent crc is kept of all data sent from one processor to another, and received from one processor to another, and at the end of each checkpoint the crcs are compared. If they do not match, there was an error. Preferably, the crcs are cleared and restarted at each checkpoint.

The basic functionality is to calculate a CRC of all packet data that has been successfully transmitted across a given link. This CRC is done on both ends of the link thereby allowing an independent check on all data that are believed to have been correctly transmitted. Preferably, all links have this CRC coverage, and the CRC used in this link level check is different from that used in the packet transfer protocol. This independent check, if successfully passed, virtually eliminates the possibility that any data errors were missed during the previous transfer period. This period can be any length of time, and, for instance, may be at least several minutes.

This technique requires no overhead in terms of data usage as it its done entirely on the side. For example, the link level CRCs can be checked via the DCR at any time that the links are not active. A convenient time is likely to be during checkpoints. The size of the data and therefore the CRC is determined by the size of the network interface. For the torus, an 8 bit version can be used, while for the tree a 32 bit version may be appropriate.

Preferred link level CRC's are discussed below. Initially, it may be noted that the receive side CRC may be the same for both the tree network and the torus configuration, and this CRC can also be used on the send side of the torus architecture. The sending side link level CRC for the torus is different, however, than for the tree because the torus will send packets which may not be resent.

Figure 5:
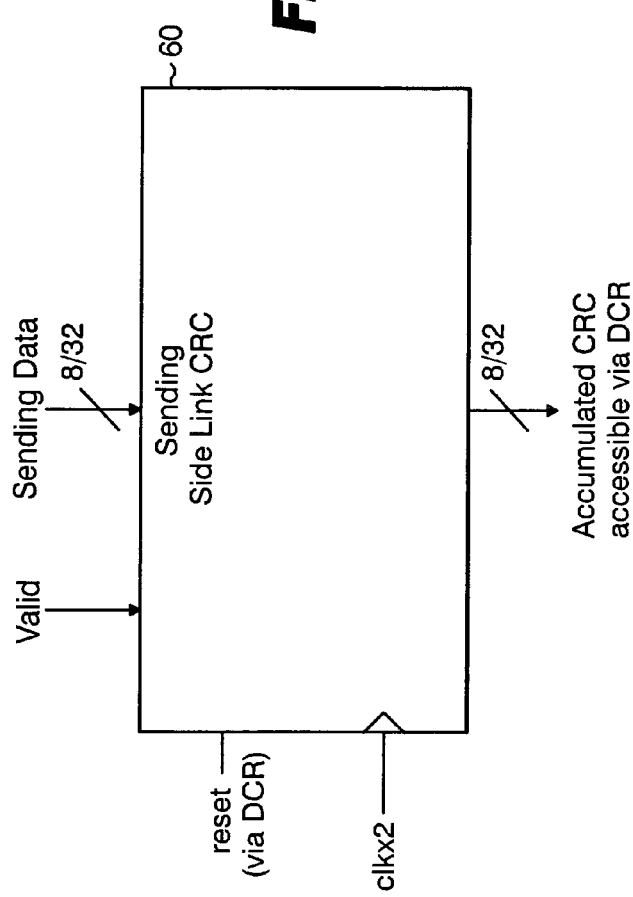
FIG. 5 is a block diagram showing a circuit and procedure for keeping a check sum at a send side of a node link.

For the tree 50, and with reference to FIG. 5, the sending side, represented at 60, will accumulate a CRC based on all data sent. Data which are sent form the retransmission buffer will not be included as that data will have already been included in the running CRC. Token and Acks, it may be noted, are not included in the CRC, only data packets.

Figure 6:
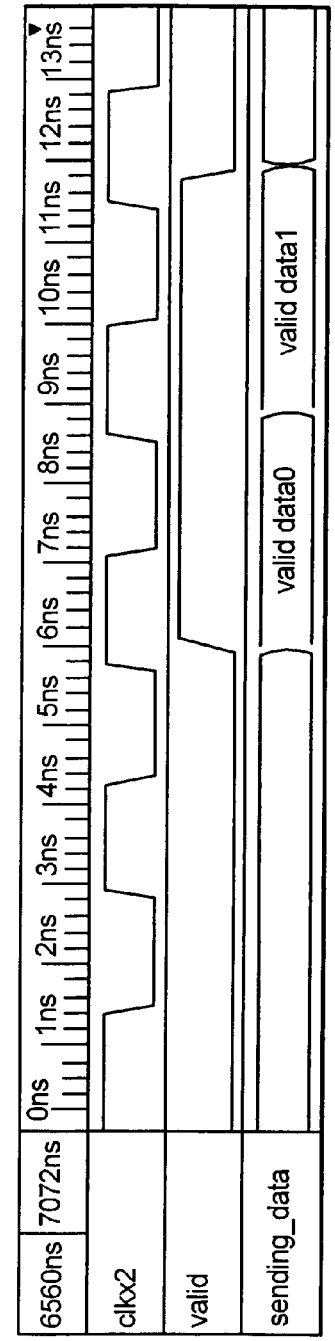
FIG. 6 is a timing diagram illustrating the relative timing of various events that occur in the circuit of FIG. 5.
Figures 7, 8:
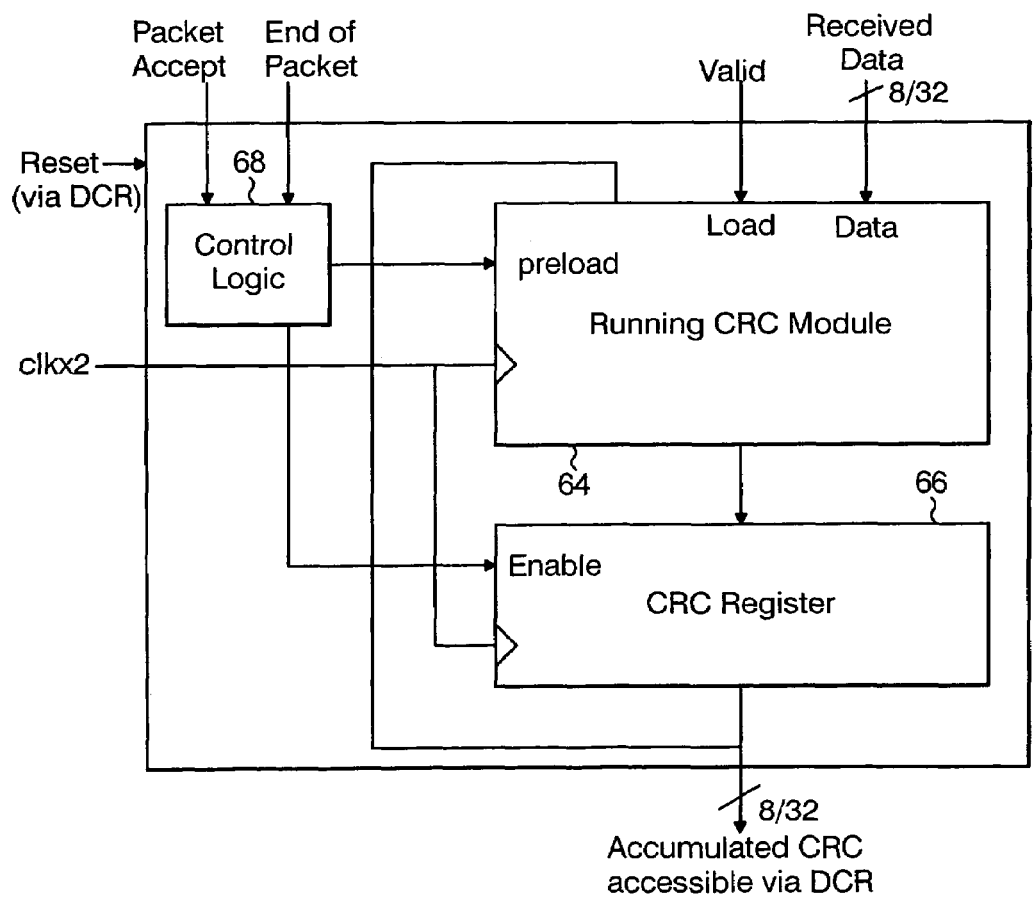
FIG. 7 is a table identifying signals used in the circuit of FIG. 5.
FIG. 8 is a block diagram illustrating a second procedure for keeping a crc.

FIG. 6 shows the timing of events on the sending side link level for the tree, and the table of FIG. 7 identifies signals used in this procedure.

A second procedure is used for the receiving side of the CRC for the tree, and for both the sending side and the receiving side CRC for the torus. More particularly, with reference to FIG. 8, the receiving side will accumulate a CRC based on all data correctly received. This is also used for the sending side logic on the torus. As we should not include a packet in this link level CRC until it is determined to be without error, additional features are used here. Data that is being received and that can potentially be an acceptable data packet (indicated via the "Valid" signal) is included in the running crc by loading it into the running CRC module 64. When the end of a packet is seen and the packet has passed all integrity tests (packet accept="1") the output of the running CRC module is captured into the receiving side CRC register 66. This is indicated via the "Packet Accept" signal. If a packet is found to be in error or is to be ignored due to the error recovery protocol, the running CRC module is preloaded with the previously saved CRC register. This procedure, which is under the control of control logic unit 68, will ensure that the CRC register will contain the CRC for all data that was accepted over the link.

Figure 9:
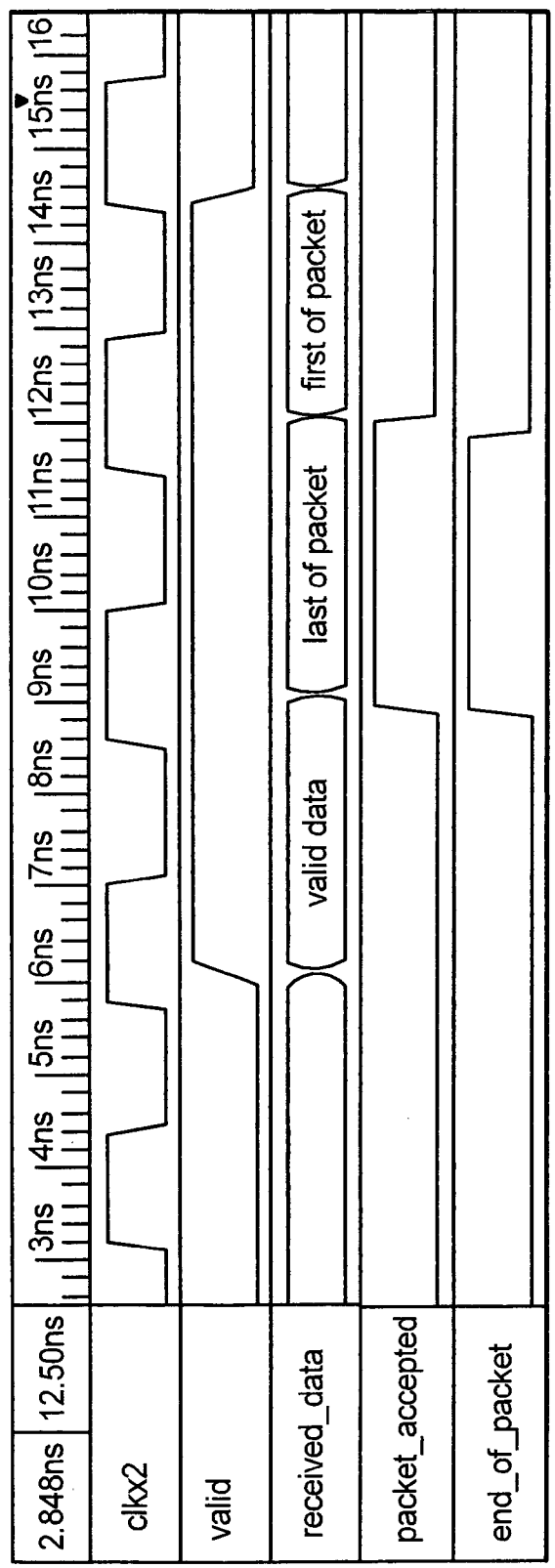
FIG. 9 is a timing diagram showing the relative timing of various events that occur in the circuits of FIG. 8.

The timing relationship for the input signals is given in FIG. 9. It may be preferred to pipeline the "received byte" at least one cycle to meet these timing requirements. The table of FIG. 10 identifies signals used in this procedure.

Figure 11:
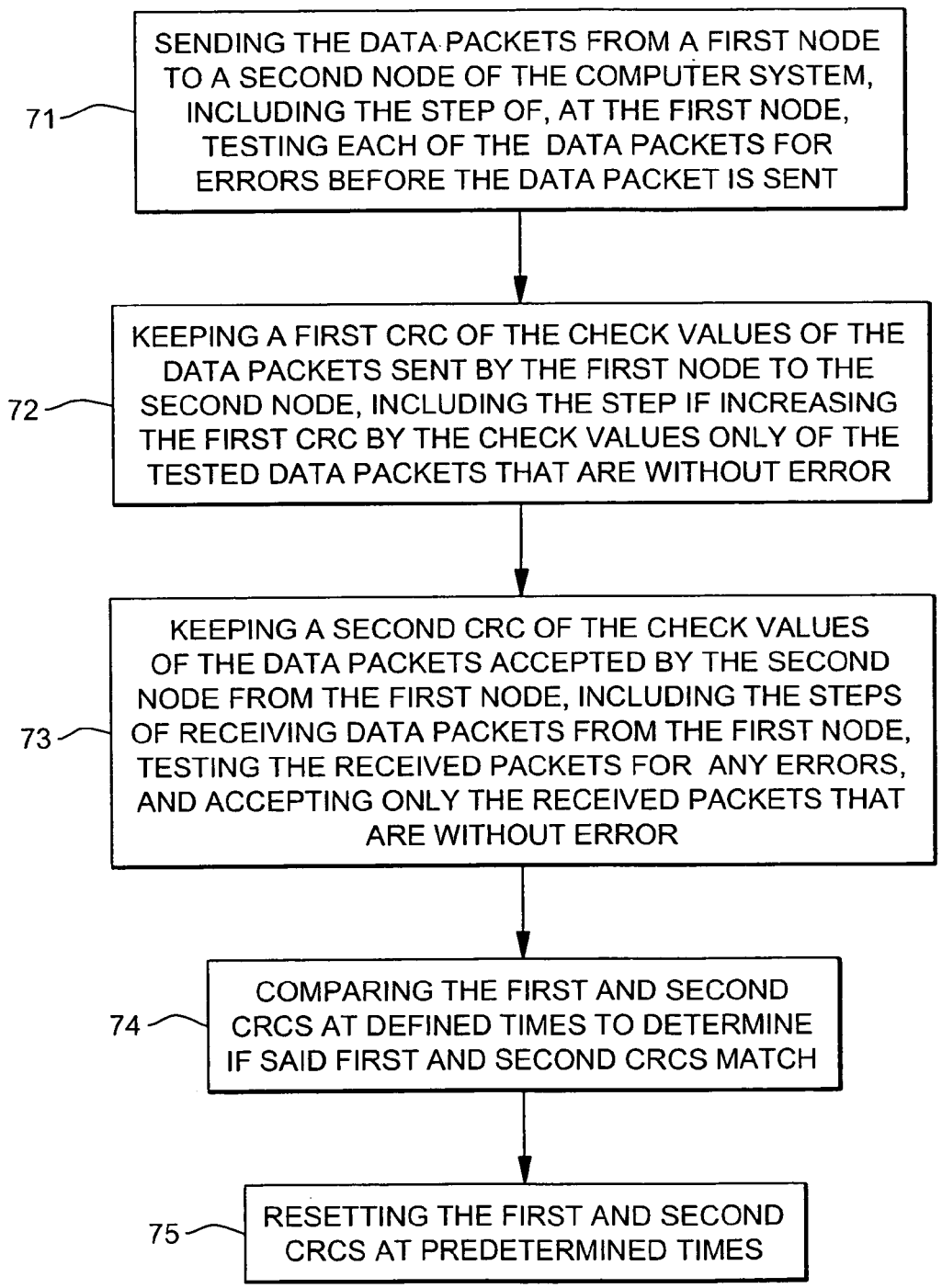
FIGS. 11–13 illustrate a preferred method embodying the present invention.
Figure 12:
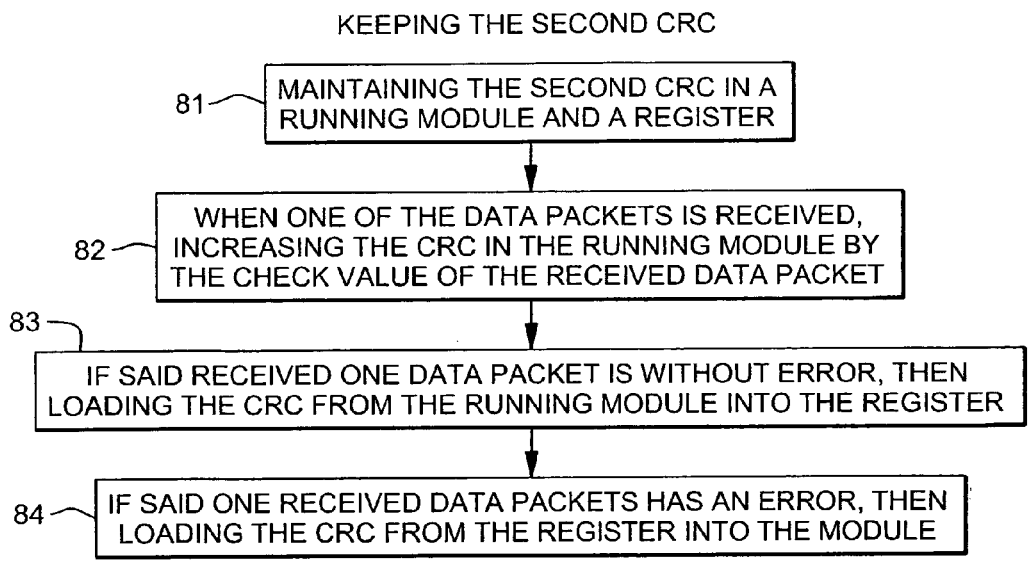
Figure 13:
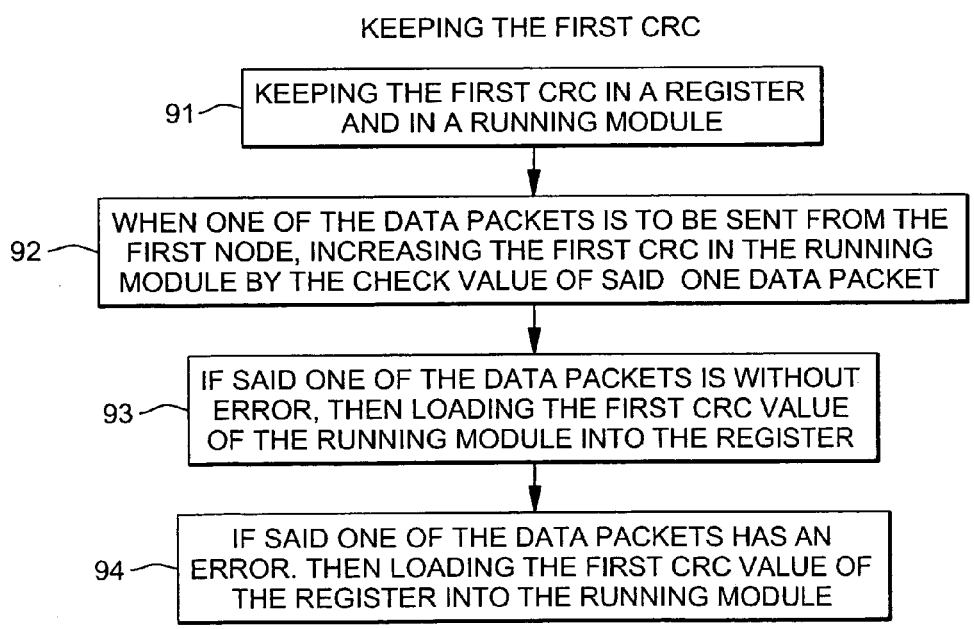

FIGS. 11–13 illustrate a preferred method embodying the present invention for checking a series of data packets transmitted from one node to another node of a computer system for an error, where each of the packets includes a check value. At step 71, the data packets are sent from a first node to a second node of the computer system, including the step of, at the first node, testing each of the data packets for errors before the data packet is sent. Step 72 is to keep a first crc of the check values of the data packets sent by the first node to the second node, including the step of increasing the first crc by the check values only of the tested data packets that are without error.

Step 73 is to keep a second crc of the check values of the data packets accepted by the second node from the first node, including the steps of receiving data packets from the first node, testing the received packets for any errors, and accepting only the received data packets that are without error. At step 74, the first and second crcs are compared at defined times to determine if said first and second crcs match; and at step 75 the first and second crcs are reset at predetermined times.

FIG. 12 shows preferred details of the step of keeping the second crc. At step 81, the second crc is maintained in a running module and in a register. At step 82, when one of the data packets is received, the crc in the running module is increased by the check value of the received data packet. At step 83, if said received one data packet is without error, then the crc from the running module is loaded into the register. At step 84, if said one received data packets has an error, then the crc from the register is loaded into the module FIG. 13 shows preferred details of the step of keeping the first crc. At step 91, the first crc is kept in a register and in a running module. At step 92, when one of the data packets is to be sent from the first node, the first crc in the running module is increased by the check value of said one data packet. At step 93, if said one of the data packets is without error, then the first crc value of the running module is loaded into the register. At step 94, if said one of the data packets has an error, then the first crc value of the register is loaded into the running module.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method of checking a series of data packets transmitted from one node of a computer system to another node of the computer system for an error, each of the packets including a check value, the method comprising the steps of:

sending the data packets from a first node to a second node of the computer system;

keeping a first, running crc of the check values of all the data packets sent by the first node to the second node over a given period, wherein at least a plurality of the data packets are sent by the first node to the second node over said given period;

keeping a second, running crc of the check values of all the data packets accepted by the second node from the first node over said given period; and comparing the first and second, running crcs at defined times to determine if said first and second crcs match.

2. A method according to claim 1, wherein the step of keeping the second crc includes the steps of:

receiving data packets from the first node;

testing the received packets for any errors; and accepting only the received data packets that are without error.

3. A method according to claim 2, wherein:

the sending step includes the step of, at the first node, testing each of the data packets for errors before the data packet is sent; and the step of keeping the first crc includes the step of increasing the first crc by the check values only of the tested data packets that are without error.

4. A method of checking a series of data packets transmitted from one node of the computer system for an error, each of the packets including a check value, the method comprising the steps of:

sending the data packets from a first node to a second node of the computer system;

keeping a first crc of the check values of the data packets sent by the first node to the second node;

keeping a second crc of the check values of the data packets accepted by the second node from the first node;

comparing the first and second crcs at defined times to determine if said first and second crcs match; and wherein the step of keeping the second crc includes the steps of:

maintaining the second crc in a running module and in a register;

when one of the data packets is received, increasing the crc in the running module by the check value of the received data packet;

if said received one data packet is without error, then loading the crc from the running module into the register; and if said one received data packets has an error, then loading the crc from the register into the module.

5. A method of checking a series of data packets transmitted from one node of the computer system for an error, each of the packets including a check value, the method comprising the steps of:

sending the data packets from a first node to a second node of the computer system;

keeping a first crc of the check values of the data rackets sent by the first node to the second node;

keeping a second crc of the check values of the data packets accepted by the second node from the first node;

comparing the first and second crcs at defined times to determine if said first and second crcs match; and wherein the step of keeping the first crc includes the steps of:

keeping the first crc in a register and in a running module;

when one of the data packets is to be sent from the first node, increasing the first crc in the running module by the check value of said one data packet;

if said one of the data packets is without error, then loading the first crc value of the running module into the register; and if said one of the data packets has an error, then loading the first crc value of the register into the running module.

6. A method according to claim 1, further comprising the step of resetting the first and second crcs at predetermined times.

7. A system for checking a series of data packets transmitted from one node of a computer system to another node of the computer system for an error, each of the packets including a check value, the system comprising:

means for sending the data packets from a first node to a second node of the computer system;

means for keeping a first, running crc of the check values of all the data packets sent by the first node to the second node over a given period, wherein at least a plurality of the data packets are sent by the first node to the second node over said given period;

means for keeping a second, running crc of the check values of all the data packets accepted by the second node from the first node over said given period; and a logic circuit for comparing the first and second, running crcs at defined times to determine if said first and second crcs match.

8. A system according to claim 7, wherein the means for keeping the second crc includes:

means for receiving data packets from the first node;

means for testing the received packets for any errors; and means for accepting only the received data packets that are without error.

9. A system according to claim 8, wherein the means for keeping the second crc further includes a running module for keeping the second crc;

a register also for keeping the second crc;

means for increasing the crc in the running module by the check value of the received data packet when one of the data packets is received; and a control logic unit for loading the crc from the running module into the register if said received one data packet is without error, and for loading the crc from the register into the module if said one received data packets has an error.

10. A system according to claim 7, wherein:

the sending means includes means, at the first node, for testing each of the data packets for errors before the data packet is sent; and the means for keeping the first crc includes means for increasing the first crc by the check values only of the tested data packets that are without error.

11. A system according to claim 10, wherein the means for keeping the first crc further includes:

a register for keeping the first crc;

a running module also for keeping the first crc;

means for increasing the first crc in the running module by the check value of said one data packet when one of the data packets is to be sent from the first node; and a control logic unit for loading the first crc value of the running module into the register if said one of the data packets is without error, and for loading the first crc value of the register into the running module if said one of the data packets has an error.

12. A system according to claim 7, wherein the first and second crcs are reset at predetermined times.

13. A program storage device readable by machine, tangibly embodying a program of instructions executable by the machine to perform method steps for checking a series of data packets transmitted from one node of a computer system to another node of the computer system for an error, each of the packets including a check value, the method comprising the steps of:

sending the data packets from a first node to a second node of the computer system;

keeping a first, running crc of the check values of all the data packets sent by the first node to the second node over a given period, wherein at least a plurality of the data packets are sent by the first node to the second node over said given period;

keeping a second, running crc of the check values of all the data packets accepted by the second node from the first node over said given period; and comparing the first and second, running crcs at defined times to determine if said first and second crcs match.

14. A program storage device according to claim 13, wherein the step of keeping the second crc includes the steps of:

receiving data packets from the first node;

testing the received packets for any errors; and accepting only the received data packets that are without error.

15. A program storage device according to claim 14, wherein the step of keeping the second crc includes the further steps of:

maintaining the second crc in a running module and in a register;

when one of the data packets is received, increasing the crc in the running module by the check value of the received data packet;

if said received one data packet is without error, then loading the crc from the running module into the register; and if said one received data packets has an error, then loading the crc from the register into the module.

16. A program storage device according to claim 14, wherein:

the sending step includes the step of, at the first node, testing each of the data packets for errors before the data packet is sent; and the step of keeping the first crc includes the step of increasing the first crc by the check values only of the tested data packets that are without error.

17. A program storage device according to claim 16, wherein the step of keeping the first crc includes the further steps of:

keeping the first crc in a register and in a running module;

when one of the data packets is to be sent from the first node, increasing the first crc in the running module by the check value of said one data packet;

if said one of the data packets is without error, then loading the first crc value of the running module into the register; and if said one of the data packets has an error, then loading the first crc value of the register into the running module.

18. A program storage device according to claim 13, further comprising the step of resetting the first and second crcs at predetermined times.

* * * * *